(12) United States Patent
Cook et al.

(10) Patent No.: US 6,998,906 B1
(45) Date of Patent: Feb. 14, 2006

(54) LOW PASS FILTER SYSTEMS AND METHODS

(75) Inventors: Thomas Cook, Austin, TX (US); Frederic Deboes, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/834,528

(22) Filed: Apr. 29, 2004

(51) Int. Cl.
*H01K 5/00* (2006.01)

(52) U.S. Cl. .................. 327/558; 327/34; 327/551; 708/300

(58) Field of Classification Search ........ 327/551–559, 327/34; 708/300
See application file for complete search history.

(56) References Cited

U.S. PATENT DOCUMENTS

| | | | |
|---|---|---|---|
| 3,579,122 A | | 5/1971 | Paine et al. |
| 3,973,256 A | | 8/1976 | Stoesser et al. |
| 5,057,794 A | * | 10/1991 | Shih .................. 331/1 A |
| 5,459,398 A | | 10/1995 | Hansen et al. |
| 5,652,773 A | * | 7/1997 | Lu .................... 375/371 |
| 5,966,034 A | * | 10/1999 | Leon .................. 327/34 |
| 6,038,267 A | * | 3/2000 | Oura et al. ............ 375/329 |
| 6,356,142 B1 | | 3/2002 | Mittel |
| 6,670,831 B1 | * | 12/2003 | Mashimo ............. 327/34 |
| 6,823,029 B1 | * | 11/2004 | Chapman et al. ...... 375/354 |

OTHER PUBLICATIONS ispPAC-POWR1208 data sheet, Lattice Semiconductor Corporation, Jan. 2004, pp. 1-34.
ispPAC-POWR604 data sheet, Lattice Semiconductor Corporation, Jan. 2004, pp. 1-29.
SMT4004 data sheet, Summit Microelectronics, Inc., Jun. 2003, pp. 1-36.
LTC1422 data sheet, Linear Technology, 1997, pp. 1-16.

* cited by examiner

*Primary Examiner*—Dinh T. Le
(74) *Attorney, Agent, or Firm*—MacPherson Kwok Chen & Heid LLP; Greg J. Michelson

(57) ABSTRACT

Systems and methods are disclosed herein to provide low pass filters. For example, in accordance with an embodiment of the present invention, a synchronous low pass filter is disclosed. The filter may be employed, for example, to suppress signal transients in power supply monitoring applications.

20 Claims, 2 Drawing Sheets

LOW PASS FILTER SYSTEMS AND METHODS

TECHNICAL FIELD

The present invention relates generally to electrical circuits and, more particularly, to low pass filter techniques.

BACKGROUND

Various applications often require the filtering of noise or other transient signals from a desired signal. For example, in a power supply monitoring application, it may be desirable to suppress very short (e.g., high frequency) transient signals to prevent a degradation or a malfunction from occurring for the power supply monitoring application. As a specific example, the power supply monitoring circuitry may falsely trigger a downstream controller circuit to take an incorrect action due to the presence of transient signals.

Various analog and digital approaches exist to address transient signals. For example, an analog approach may slow the signal propagation along the analog signal path to filter out high-frequency transients. However, this approach may be prone to metastability problems, because the analog signal sent to a downstream digital circuit (e.g., a controller or a state machine) is asynchronous. Furthermore, an analog filtering approach may offer limited flexibility, because it can not easily implement widely separated pole frequencies.

As another example, a digital approach may be based on a shift register design with subsequent decisions of a comparator being clocked into an n-bit long register. When all n bits have the same desired logic state (e.g., a logical high level (1)), the final decision is propagated downstream. This approach may address the metastability issues of the analog approach by processing the information in the digital domain. However, this approach may be viewed as a delay element with a delay present in one direction (e.g., having all n bits equal a one), but not in the other direction (e.g., one zero in the n-bit stream is sufficient to prevent a one (1) decision). Thus, the approach may be represented as a low pass filter in one direction and an all pass filter in the other direction and, therefore would not be considered a digital equivalent to an analog filter. Further, this approach may also not easily implement widely separated pole frequencies.

Another approach, as an example, may employ a ripple counter that counts up with incoming ones and gets reset with an incoming zero. This approach attempts to address the limited flexibility, but generally remains an asymmetrical implementation where, without extensive decoding, frequencies synchronous to the filter will be decoded as noise. As a result, there is a need for improved filtering techniques.

SUMMARY

Systems and methods are disclosed herein to provide low pass filters. For example, in accordance with an embodiment of the present invention, a synchronous low pass filter is disclosed. The filter may be employed, for example, to suppress signal transients in power supply monitoring applications. As an example, in accordance with an embodiment of the present invention, the filter may include a saturating up/down counter, which may serve as a moving average filter and provide a digital implementation of an analog integrator.

More specifically, in accordance with one embodiment of the present invention, a filter includes a counter adapted to receive an input signal and a clock signal and provide a counter output signal, wherein the counter is adapted to count towards a first count value for each clock cycle of the clock signal that a logical high value is provided by the input signal and to count towards a second count value for each clock cycle of the clock signal that a logical low value is provided by the input signal, with the counter output signal providing a first indication when the first count value is reached and providing a second indication when the second count value is reached; and a logic circuit adapted to receive the counter output signal and the input signal and provide a filter output signal based on the counter output signal and the input signal.

In accordance with another embodiment of the present invention, a circuit includes a counter adapted to receive an input signal and a clock signal and provide a first counter signal and a second counter signal, wherein the counter increments its count up towards a maximum value for each triggering of the clock signal that a logical high value is provided by the input signal and increments its count down towards a minimum value for each triggering of the clock signal that a logical low value is provided by the input signal, the counter indicating with the first counter signal when the maximum value is reached and indicating with the second counter signal when the minimum value is reached; and a logic circuit adapted to receive the input signal and the first and second counter signals and provide a first value for an output signal when the input signal provides a logical high value and the first counter signal indicates that the maximum value has been reached and provides a second value for the output signal when the input signal provides a logical low value and the second counter signal indicates that the minimum value has been reached.

In accordance with another embodiment of the present invention, a method of filtering an input signal includes incrementing a count value for each logical high value provided by the input signal; decrementing the count value for each logical low value provided by the input signal; providing a first value for an output signal if the count value reaches a first count value; and providing a second value for the output signal if the count value reaches a second count value.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
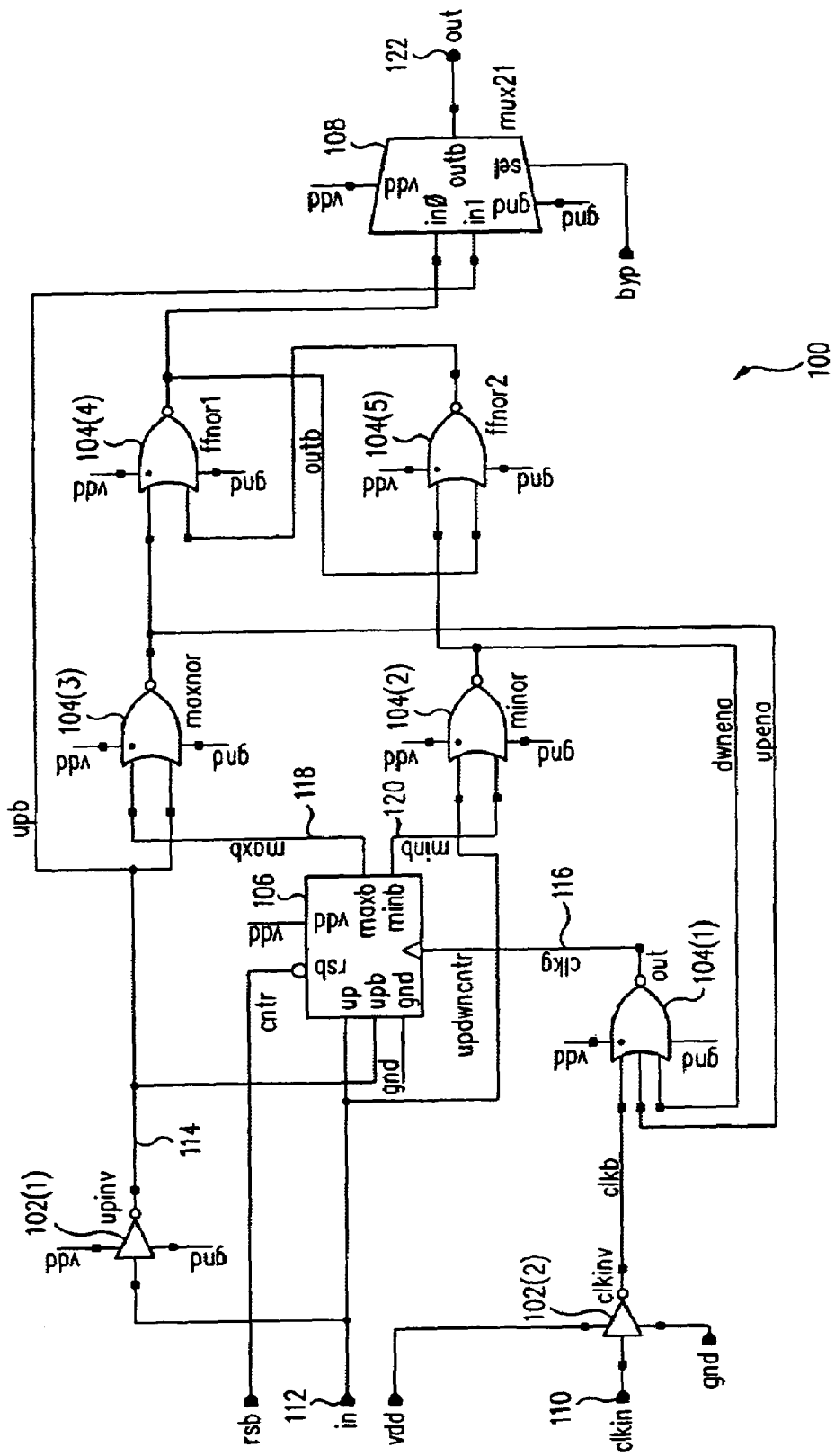
FIG. 1 shows a circuit diagram illustrating a filter in accordance with an embodiment of the present invention.

FIG. 1 shows a circuit diagram illustrating a filter 100 in accordance with an embodiment of the present invention. Filter 100 includes inverters 102, logic gates 104, a counter 106, and a multiplexer 108 (with multiple elements separately referenced, e.g., inverter 102(1) and inverter 102(2)). Filter 100 receives a clock (clkin) signal 110 and an input (in) signal 112 and provides an output (out) signal 122. A reset (rsb) signal, a supply voltage (vdd), a reference voltage (e.g., ground (gnd)), and a bypass (byp) signal are also received by filter 100. The bypass signal, when asserted, allows input signal 112 to be selected by multiplexer 108 and therefore bypass filter 100 (e.g., the complement of input signal 112 is provided to multiplexer 108 via an input (in1) terminal, with multiplexer 108 providing the complement of the signal value received at the input (in1) terminal as output signal 122, thus input signal 112 is provided as output signal 122 when the bypass signal is asserted).

Input signal 112 provides a logical high value (e.g., referred to as a high, "H," or "1") or a logical low value (e.g., referred to as a low, "L," or "0") to filter 100. When the value of input signal 112 is high or low, counter 106 counts up or down, respectively. As explained herein, counter 106 (e.g., an up/down counter) within filter 100 saturates high when it reaches its high count, but does not roll over. Likewise, counter 106 within filter 100 saturates low when it reaches its low count, but does not roll over. This ensures that in the event of a stable analog event, the digital image of this event will be stable as well. When the analog event changes, filter 100 (e.g., a moving average filter) will track it (e.g., within a clock cycle).

Filter 100 may be implemented to be synchronous with other digital circuits, such as for example with a downstream digital state machine, and will minimize metastability-related failures. However, unlike some conventional techniques, filter 100 with counter 106 (e.g., a saturating up/down counter) can integrate up with incoming ones (i.e., high values), integrate down with incoming zeroes (i.e., low values), and will reach its high or low output state if a sufficient number of corresponding ones or zeros are counted.

In general, filter 100 with counter 106 may be viewed as functioning as a moving average filter that stores past events and utilizes its past states to determine its next state. Thus, filter 106 may be viewed as an accurate digital implementation of an analog integrator.

As illustrated in FIG. 1, counter 106 receives input signal 112, an input signal 114 from inverter 102(1) (i.e., the complement of input signal 112), and a clock signal 116 from logic gate 104(1) and provides output signals 118 and 120. Logic gate 104(2) provides a logical high when input signal 112 provides a logical low and counter 106 saturates low (i.e., a low is provided by output signal 120). Logic gate 104(3) provides a logical high when input signal 112 provides a logical high and counter 106 saturates high (i.e., a low is provided by output signal 118). Consequently, logic gate 104(1) provides a low value for clock signal 116 to counter 106, regardless of the value of clock signal 110, when counter 106 saturates low and input signal 112 is at a low value or when counter 106 saturates high and input signal 112 is at a high value.

Logic gates 104(4) and 104(5) are configured as a latch (i.e., an RS flip flop), with logic gate 104(4) providing a logical low when logic gate 104(3) provides' a logical high, which results in multiplexer 108 providing a logical high via output signal 122. Logic gate 104(4) provides a logical high when logic gate 104(2) provides a logical high to logic gate 104(5), which results in multiplexer 108 providing a logical low via output signal 122. The value of output signal 122 may then be propagated, for example, to downstream logic.

Figure 2:
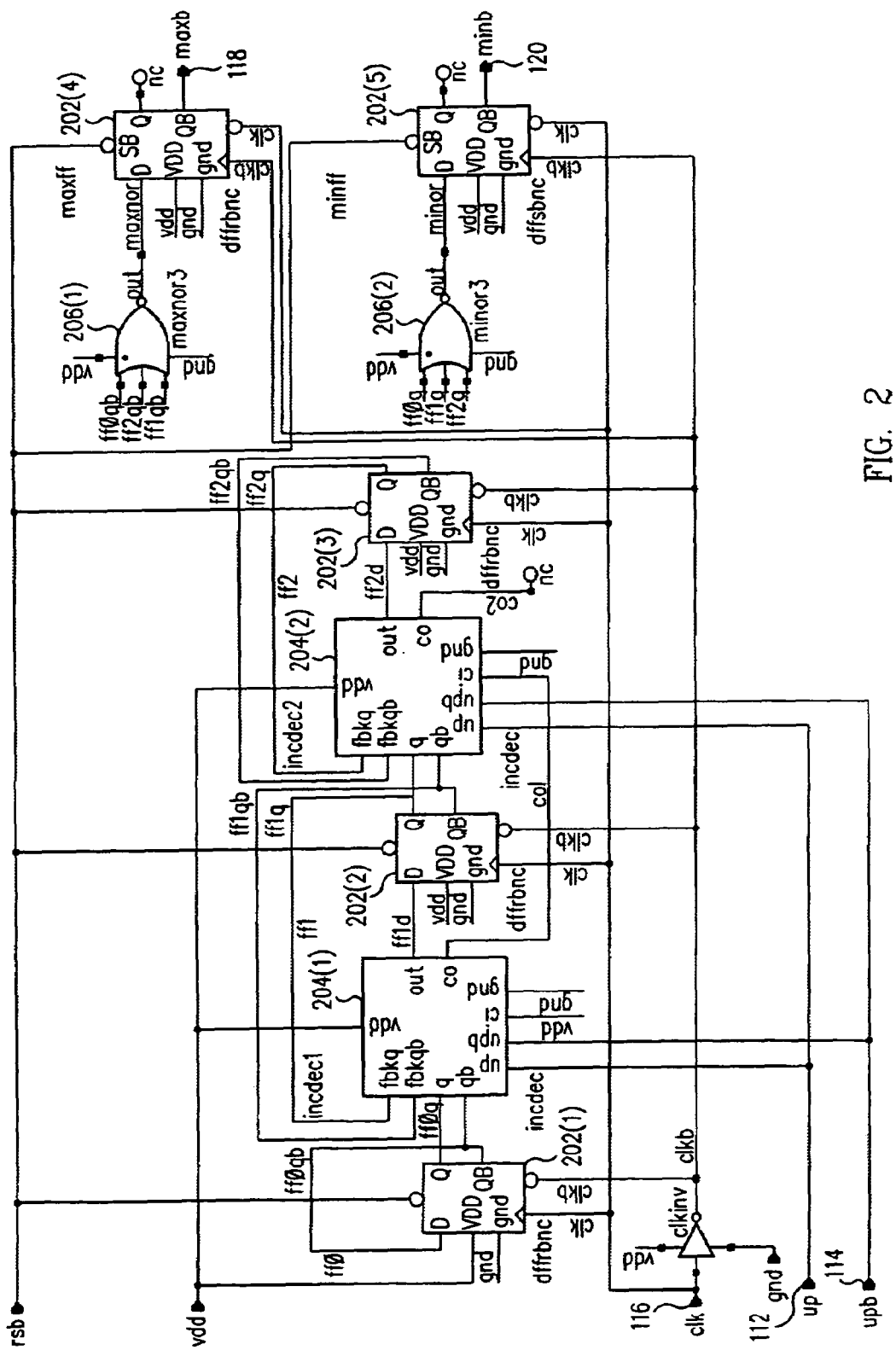
FIG. 2 shows an exemplary circuit diagram for a portion of the filter of FIG. 1 in accordance with an embodiment of the present invention.

As an implementation example, FIG. 2 shows a circuit 200, which is an exemplary circuit implementation for counter 106 of FIG. 1 in accordance with an embodiment of the present invention. Circuit 200 includes registers 202, blocks 204, and logic gates 206. Blocks 204 may represent conventional incrementer/decrementer circuits, with block 204(1) and register 202(2) paired as one increment/decrement stage and block 204(2) and register 202(3) paired as another increment/decrement stage.

Register 202(1), block 204(1) and register 202(2), and block 204(2) and register 202(3) may be viewed as forming a three-bit synchronous counter circuit. Register 202(1) provides the least significant bit, while block 204(1) and register 202(2) and block 204(2) and register 202(3) provide the other two corresponding bits. It should be understood that circuit 200 is not limited to three bits and may be modified as desired to provide a one or more bit counter. For example, additional bits may be added by including additional increment/decrement stages and expanding the logic provided by logic gates 206 to accommodate the additional inputs.

Logic gates 206(1) and 206(2) monitor signals from register 202(1) and the increment/decrement stages (i.e., formed by block 204(1) and register 202(2) and block 204(2) and register 202(3)) and provide their result to registers 202(4) and 202(5), respectively. When logic gate 206(1) provides a logical high, indicating a high count has been reached, register 202(4) provides a logical low value on output signal 118. When logic gate 206(2) provides a logical high, indicating a low count has been reached, register 202(5) provides a logical low value on output signal 120.

In general, circuit 200 (e.g., an up/down counter) includes a number of increment/decrement circuits (i.e., blocks 204(1) and 204(2)), which feed corresponding registers 202(2) and 202(3). In accordance with an embodiment of the present invention, circuit 200 may count the number of clock cycles of clock signal 116 that a given signal value on input signal 112 is present (i.e., based on the number of bits of circuit 200). For example, when input signal 112 is at a logical high, circuit 200 will start counting up until it reaches its high count (saturates high). When input signal 112 is at a logical low, circuit 200 will start counting down until it reaches its low count (saturates low).

Returning to FIG. 1, filter 100 may be employed in a variety of applications. For example, in accordance with an embodiment of the present invention, filter 100 may be utilized as a programmable synchronous low pass filter for transient signal suppression in power monitoring applications.

In terms of a general operational example for an exemplary power monitoring application and starting at an initial state, an under-voltage at a node being monitored may be indicated as a logical low on input signal 112, with filter 100 initially providing a default low on output signal 122 (i.e., the initial state). An over-voltage at the node being monitored may be indicated by a logical high on input signal 112.

When a logical high on input signal 112 is received by filter 100, counter 106 starts counting up and, for each clock cycle of clock signal 116 that the logical high is present on input signal 112, counter 106 increments by one. The value on output signal 122 remains unchanged.

When the logical high on input signal 112 remains past a pre-defined duration (e.g., a certain number of clock cycles), counter 106 will reach the maximum count and provide a logical low on output signal 118, which results in a logical high on output signal 122 (which is maintained, i.e., no rollover or overflow by counter 106). When a logical low is provided by input signal 112, counter 106 will start counting down, but the output of counter 106 (e.g., the logical low on output signal 118) will be unchanged unless the logical low on input signal 112 remains for the pre-defined duration (e.g., a certain number of clock cycles).

If the logical low on input signal 112 does not remain for the pre-defined duration, counter 106 then reverts direction and starts counting up for as long as the logical high is present on input signal 112 (e.g., until the high count is reached). The value of output signal 122 does not change state and remains at its current state while counter 106 counts up or down until a high or low count is reached. For example, if the signal values on input signal 112 (e.g., an equivalent analog signal) averages to one-half of full scale, filter 100 will average to one-half of full count and output signal 122 will remain unchanged from its previous state. When the signal value of input signal 112 is weighted up (i.e., a logical high) or down (i.e., a logical low), filter 100 (e.g., a moving average filter) will follow. Consequently, in accordance with an embodiment of the present invention, filter 100 may be viewed as a programmable digital equivalent of an analog integrator.

Embodiments described above illustrate but do not limit the invention. It should also be understood that numerous modifications and variations are possible in accordance with the principles of the present invention. Accordingly, the scope of the invention is defined only by the following claims.

We claim:

1. A filter comprising:
    a counter adapted to receive an input signal and a clock signal and provide a counter output signal, wherein the counter is adapted to count towards a first count value for each clock cycle of the clock signal that a logical high value is provided by the input signal and to count towards a second count value for each clock cycle of the clock signal that a logical low value is provided by the input signal, with the counter output signal providing a first indication when the first count value is reached and providing a second indication when the second count value is reached; and
    a logic circuit adapted to receive the counter output signal and the input signal and provide a filter output signal based on the counter output signal and the input signal.

2. The filter of claim 1, wherein the first count value is a maximum count value and the second count value is a minimum count value of the counter.

3. The filter of claim 1, wherein the logic circuit provides a first value for the filter output signal, when the counter output signal provides the first indication and the input signal provides a logical high value, and provides a second value for the filter output signal when the counter output signal provides the second indication and the input signal provides a logical low value.

4. The filter of claim 1, wherein the logic circuit sets the clock signal to the counter to a fixed value when the counter output signal provides the first indication and the input signal provides a logical high value or when the counter output signal provides the second indication and the input signal provides a logical low value.

5. The filter of claim 1, further comprising a multiplexer, coupled to the logic circuit, adapted to provide the filter output signal or the input signal as an output signal under control of a bypass signal.

6. The filter of claim 1, wherein the filter functions approximately as a digital implementation of an analog integrator.

7. The filter of claim 1, wherein the counter comprises:
    a first register adapted to represent a least significant bit;
    at least one increment/decrement stage adapted to represent another corresponding bit; and
    a first logic circuit adapted to monitor the first register and the at least one increment/decrement stage and provide the counter output signal.

8. The filter of claim 7, wherein the first register and the at least one increment/decrement stage comprise a synchronous counter.

9. A circuit comprising:
    a counter adapted to receive an input signal and a clock signal and provide a first counter signal and a second counter signal, wherein the counter increments its count up towards a maximum value for each triggering of the clock signal that a logical high value is provided by the input signal and increments its count down towards a minimum value for each triggering of the clock signal that a logical low value is provided by the input signal, the counter indicating with the first counter signal when the maximum value is reached and indicating with the second counter signal when the minimum value is reached; and
    a logic circuit adapted to receive the input signal and the first and second counter signals and provide a first value high value and the first counter signal indicates that the maximum value has been reached and provides a second value for the output signal when the input signal provides a logical low value and the second counter signal indicates that the minimum value has been reached.

10. The circuit of claim 9, wherein the logic circuit sets the clock signal to the counter to a fixed value when the logic circuit provides the first value or the second value.

11. The circuit of claim 9, wherein the logic circuit further comprises a latch to store the output signal.

12. The circuit of claim 9, further comprising a multiplexer adapted to provide the output signal or the input signal as a multiplexer output signal for the circuit as determined by a control signal.

13. The circuit of claim 9, wherein the counter comprises:
    a synchronous counter; and
    a first logic circuit coupled to the synchronous counter and adapted to provide the first counter signal and the second counter signal.

14. The circuit of claim 13, wherein the synchronous counter comprises:
    a register; and
    at least one increment/decrement stage.

15. The circuit of claim 9, wherein the circuit functions as a moving average filter.

16. A method of filtering an input signal, the method comprising:
    incrementing a count value for each logical high value provided by the input signal;
    decrementing the count value for each logical low value provided by the input signal;
    providing a first value for an output signal if the count value reaches a first count value;

providing a second value for the output signal if the count value reaches a second count value; and receiving a bypass signal adapted to select the output signal or the input signal to provide as a final output signal.

17. The method of claim 16, wherein the first value is provided if the count value reaches the first count value and the input signal is providing a logical high value, and the second value is provided if the count value reaches the second count value and the input signal is providing a logical low value.

18. The method of claim 16, wherein the method provides a moving average filtering function of the input signal.

19. The method of claim 16, wherein the incrementing is not performed if the count value reaches a maximum value, and the decrementing is not performed if the count value reaches a minimum value.

20. The method of claim 16, wherein the first count value is a maximum count value and the second count value is a minimum count value of a counter.

* * * * *

UNITED STATES PATENT AND TRADEMARK OFFICE
CERTIFICATE OF CORRECTION

| | | |
|---|---|---|
| PATENT NO. | : 6,998,906 B1 | Page 1 of 1 |
| APPLICATION NO. | : 10/834528 | |
| DATED | : February 14, 2006 | |
| INVENTOR(S) | : Cook et al. | |

It is certified that error appears in the above-identified patent and that said Letters Patent is hereby corrected as shown below:

Col. 6, line 33, replace "value high value" with -- value for an output signal when the input signal provides a logical high value --.

Signed and Sealed this

Eighth Day of May, 2007

JON W. DUDAS
*Director of the United States Patent and Trademark Office*